United States Patent [19]

Thornton et al.

[11] Patent Number: 4,606,968
[45] Date of Patent: Aug. 19, 1986

[54] ELECTROSTATIC DISSIPATING FABRIC

[75] Inventors: Peter B. Thornton, Bronxville; Stanley H. Cone; George W. Booz, both of Hornell, all of N.Y.

[73] Assignee: Stern and Stern Textiles, Inc., New York, N.Y.

[21] Appl. No.: 517,124

[22] Filed: Jul. 25, 1983

[51] Int. Cl.⁴ .............................................. D03D 3/00
[52] U.S. Cl. .................................... 428/229; 57/901; 139/425 R; 428/224; 428/225; 428/253; 428/258; 428/259; 428/257; 428/408; 428/297; 428/298
[58] Field of Search ............... 57/901; 139/425 R; 428/225, 253, 257, 258, 259, 367, 408, 902, 229, 224, 244, 297, 298

[56] References Cited

U.S. PATENT DOCUMENTS

| | | | |
|---|---|---|---|
| 3,288,175 | 11/1966 | Valko | 139/425 R |
| 3,371,250 | 2/1968 | Ross et al. | 139/425 R |
| 3,422,460 | 1/1969 | Burke et al. | 139/425 R |
| 3,479,565 | 11/1969 | Ross et al. | 139/425 R |
| 3,586,597 | 6/1971 | Okuhashi | 139/425 R |
| 3,631,298 | 12/1971 | Davis | 139/425 R |
| 3,706,195 | 12/1972 | Davis et al. | 57/140 BY |
| 3,851,456 | 12/1974 | Hanada et al. | 57/140 BY |
| 3,878,174 | 4/1975 | Jenkins et al. | 57/140 R |
| 3,882,667 | 5/1975 | Barry | 57/157 AS |
| 3,971,202 | 7/1976 | Windley | 57/140 BY |
| 3,986,530 | 10/1976 | Maekawa | 139/425 R |
| 4,045,949 | 9/1977 | Paton et al. | 428/359 |
| 4,064,075 | 12/1977 | Hull | 252/511 |
| 4,145,473 | 3/1979 | Samuelson et al. | 428/373 |
| 4,232,082 | 11/1980 | Noritake | 428/373 |
| 4,296,855 | 10/1981 | Blalock | 428/257 |
| 4,357,390 | 11/1982 | Ozaki et al. | 428/398 |
| 4,627,233 | 12/1985 | Tanaka et al. | 428/389 |

*Primary Examiner*—James J. Bell
*Attorney, Agent, or Firm*—Amster, Rothstein & Ebenstein

[57] ABSTRACT

An electrostatic dissipating fabric constructed of a woven or knitted base fabric having an integrally woven or knitted grid structure which is raised above the surface of the base fabric thereby resulting in increased electrostatic dissipation performance. The grid is formed from a static discharge yarn plied to a carrier yarn which is then woven or knitted into the fabric in the warp direction, the fill direction or both, thereby producing a fabric which exhibits the rapid yet controlled dissipation of static electricity into the air. Such fabric can be used for anti-static garments, anti-static covering cloths, filtration media and the like.

21 Claims, 7 Drawing Figures

ELECTROSTATIC DISSIPATING FABRIC

FIELD OF THE INVENTION

The invention relates to a fabric having a woven or knitted base fabric into which an integral grid formed of a static discharge yarn plied to a carrier yarn is woven or knitted. The grid extends above and below the surfaces of the base fabric and is formed during the initial construction of the fabric by any of several techniques described below. The raised grid allows the fabric of the present invention to exhibit superior dissipation of static electricity innocuously into the air.

The fabric of the present invention is particularly adapted for use in situations requiring the relatively rapid yet controlled dissipation of static electricity into the air to avoid sparking between the fabric and ground and to assure that dust and other particulate matter will not cling to the fabric when used as a filtration medium or as garments in an operating room or "clean room" environment.

BACKGROUND OF THE INVENTION

It is well known that normal clothing fabric when used in environments such as a clean room, hospital operating room or other areas where humidity is reduced or controlled, have the drawback of becoming charged with static electricity as a result of friction. Due to the reduced humidity the static electricity is not readily dissipated into the air. Likewise, when ordinary cloth is used as a filter medium, the friction caused by the air and particles passing through the cloth results in the buildup of static electricity. As a result, dust particles tend to cling to such cloth or filter medium decreasing the permeability of the filter reducing air flow through the filter. In some instances, the buildup of the static electricity can result in discharge of a spark traveling between the cloth and an object in the environment which is either grounded or has the opposite relative static discharge. The spark caused by the rapid discharge of static electricity can cause explosions in areas having explosive atmospheres such as hospital operating rooms or oxygen-rich environments which electronic components may be used, assembled or tested. The rapid discharge of static electricity may also cause dust explosions.

There is a need for electrostatic dissipating fabrics which can be used to construct garments, filter media and drop cloths which have characteristics appropriate for each end use. For example, the fabric used for the production of garments must be comfortable, washable without loss of its static dissipating properties, must be economical, and should be relatively opaque. For filter media, the electrostatic dissipating fabric should have a uniform and controllable permeability to air or other gases passing through the filter. For drop cloth applications, the electrostatic dissipating fabric should be fireproof yet reasonably economical.

In U.S. Pat. No. 2,845,962 an anti-static fabric is disclosed which is made from a fibrous material containing electrically conductive carbon black in combination with fibrous material free from the carbon black. Such fabric, however, does not have the desired conductivity unless a substantial amount of carbon black is used thereby resulting in reduced mechanical strength of the fiber, often leading to the fabric breaking during the processing step. Further, the appearance and hand of the product produced from fiber containing a substantial amount of carbon black is generally unsatisfactory.

U.S. Pat. No. 3,288,175 teaches the incorporation of a small quantity of metallic fibers in the textile fiber materials to produce an anti-static fabric. Such fabric, however, is difficult to process and results in a fabric which has an unsatisfactory hand. Further, a fabric produced in accordance with such method is relatively expensive.

U.S. Pat. No. 3,586,597 teaches the use of a fiber which is coated with a resinous matrix of finely divided silver or carbon black. Such coating, however, is not always sufficient to provide the necessary anti-static properties and often results in loss of anti-static properties as a result of normal processing such as dying, cutting and so forth. If such fabric is washed further degradation of the anti-static properties of the fabric occurs.

Likewise, the anti-static cloth described in U.S. Pat. No. 3,986,530 which is formed from an electrically conductive thread having electroless metal plated staple fibers and metallic filaments combined in a specific amount suffers a degradation of anti-static performance from loss of the coating as the fabric is flexed or otherwise processed or washed.

SUMMARY OF THE INVENTION

The present invention, however, by utilizing known conductive filaments in a new construction having raised stripes or grids results in an electrostatic dissipating fabric which avoids these and other disadvantages of the prior art.

It is an overall object of the present invention to produce an electrostatic dissipating fabric which, by virtue of its construction, exhibits a controlled rate of electrostatic dissipation superior to the static discharge performance of prior art fabrics and eliminates one or more of the aforesaid shortcomings of the prior art. Specifically, it is within the contemplation of the present invention to provide an improved electrostatic dissipating fabric which is woven or knitted with a base fabric of desired construction and an integral stripe and/or grid knitted or woven into the base fabric so that the stripe and/or grid extends above and below the surface of the base fabric thereby enhancing the electrostatic dissipation performance of the fabric.

It is a primary object of the present invention to provide a fabric which uniformly dissipates electrostatic buildup directly into the air before a sufficient charge can accumulate on the fabric to result in a spark.

It is a further object of the present invention to provide an electrostatic dissipating fabric which has improved comfort and hand for use in garments.

It is a further object of the present invention to provide an electrostatic dissipating fabric which can be processed and washed or cleaned without significant degradation of the static dissipation properties.

It is a further object of the present invention to provide an electrostatic dissipating fabric which is economical to produce.

It is a still further object of the present invention to provide an electrostatic dissipating fabric having a base fabric of conventional yarn of substantially any formulation constructed in a weave or knit having properties (e.g. opacity, hand, porosity) appropriate for the particular end use.

In accordance with an illustrative embodiment demonstrating objects and features of the present invention, there is provided an improved electrostatic dissipating fabric having a constructed base fabric which is either woven or knitted. The base fabric has a front and back surface. A first plurality of electroconductive yarns is constructed into the base fabric during the weaving or knitting operation and extends from the front surface of the base fabric to its back surface. The first plurality of electroconductive yarns are oriented parallel to each other and extend beyond the planes of the front and back surfaces of the base fabric in a substantially mutually parallel orientation forming a raised substantially parallel stripe or grid on both the front and back surfaces of the base fabric.

BRIEF DESCRIPTION OF THE DRAWINGS

The above brief description as well as further objects, features and advantages of the present invention will be more fully appreciated by reference to the following detailed description of the presently preferred, illustrative embodiments according to the present invention, when taken in conjunction with the accompanying drawings, wherein.

DETAILED DESCRIPTION OF THE DRAWINGS

Figure 1:
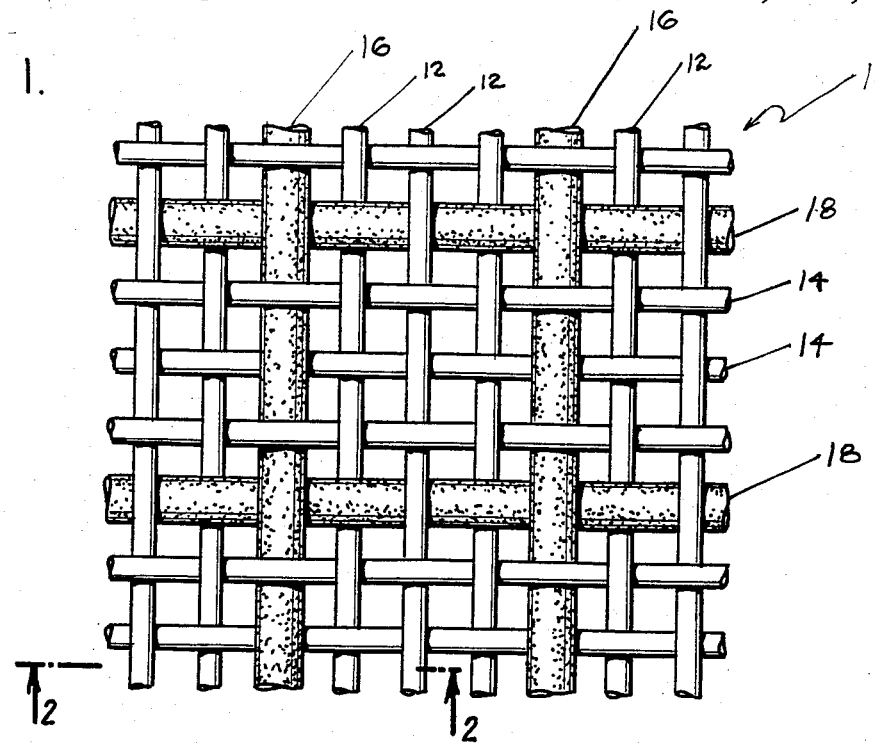
FIG. 1 is a top view of the improved fabric of the present invention in a woven construction, wherein the spacing between the yarn is increased to show the construction details.

Referring now to the drawings and specifically to FIG. 1, there is provided an improved electrostatic dissipating fabric 10 of the present invention. For the sake of illustration, the present invention is shown as a woven fabric construction in enlarged scale with the spacing between the yarns in the warp and fill direction exaggerated. Additionally, for the sake of clarity the number of warp and fill yarns has been greatly reduced.

The base fabric can be formed primarily of any nonconductive man-made fibers such as polyester, aromatic polyimide (sold under the trademark NOMEX) or natural fibers such as cotton. Although it is preferred to use filament yarns rather than spun yarns in the base fabric to reduce the likelihood of the pieces of spun yarn becoming a contaminant, either yarn type can be used for the base fabric. Generally the material chosen for the base fabric depends upon the look, color, hand and permeability desired in the end product.

In FIG. 1 the nonconductive warp yarn 12 is provided by a conventional beam (not shown) while the fill yarn 14 is provided by the shuttle or weft insertion mechanism (not shown) in a conventional manner. As shown in FIG. 1 the conductive yarn is woven into the base fabric as an integral portion of such fabric. The electroconductive warp yarn 16 is also provided by the beam (not shown) in a conventional manner and the electroconductive fill yarn 18 by the shuttle.

Figure 2:
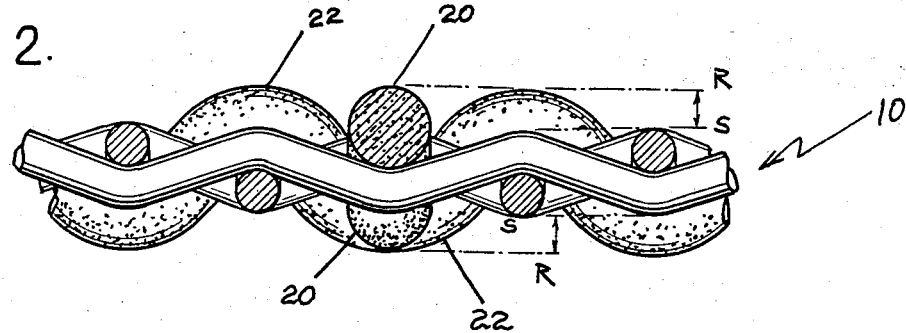
FIG. 2 is a partial section view in enlarged scale; taken substantially along the line 2—2 of FIG. 1 in the direction of the arrows.

In the electrostatic dissipating fabric shown in FIGS. 1 and 2, the electroconductive yarn 16, 18 has a larger diameter than the yarn 12, 14 forming the base fabric. Thus, as best shown in FIG. 2, when the fabric is constructed the electroconductive warp and fill yarns form a line of peaks 20, 22 along the warp and fill, respectively. Thus, although the surface of the base fabric is substantially as shown by the broken line in FIG. 2 designated by the referenced letter "S" at the top and bottom of the base fabric, the electroconductive yarns form a substantially rectangular grid raised above the surface "S" of the base fabric to a distance shown by the broken line designated by the referenced letter "R".

In actuality, the fabric shown schematically in FIGS. 1 and 2 has approximately 60-90 yarns per inch in the warp and approximately 40-80 yarns per inch or "picks" per inch in the fill. Likewise, by way of example, the yarn comprising the warp and fill of the base fabric may be twice plied, 200 denier, 100 filament type yarn which has $3\frac{1}{4}$ turns per inch and is "Z" twisted while the electroconductive yarn may be 24 denier, 4 filament which has been plied to a sufficiently large denier to polyamide yarn by a $3\frac{1}{4}$ "Z" twist. The much larger plied electroconductive yarn provides the raised grid best shown in FIG. 2.

The electroconductive yarn is formed by plying carbon-doped nylon fibers such as, for example, those sold by Monsanto Textiles Company under the trademark NO SHOCK. Although it is preferred to use carbon-doped multi-filaments as such multi-filaments do not lose their electroconductivity when subject to further normal processing such as dying, bleaching and washing, it is possible to use carbon coated conductive filaments to produce the fabric of the present invention.

Figure 3:
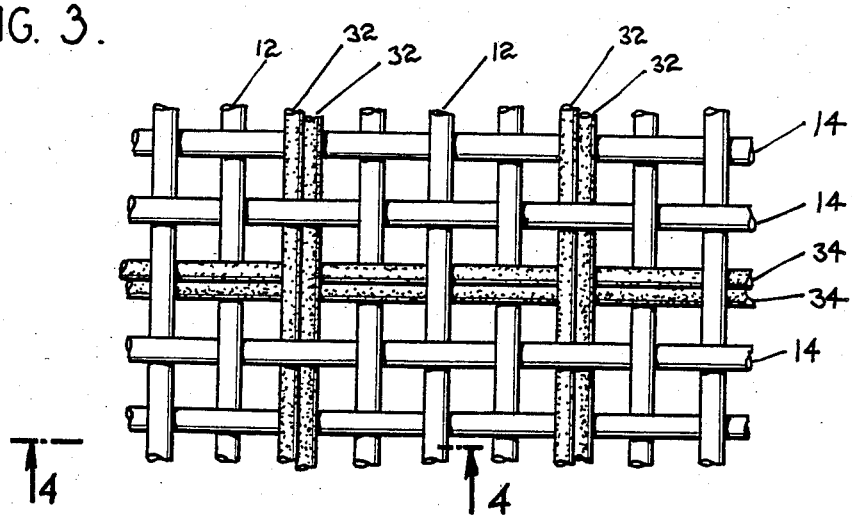
FIG. 3 is a top view of an alternate woven construction of the electrostatic dissipating fabric of the present invention.

Referring next to FIG. 3, an alternate construction 30 of the fabric of the present invention is shown. The warp yarn 12 and fill yarn 14 are the same as shown in the embodiment of the invention shown in FIGS. 1 and 2. However, the electroconductive warp yarn is provided by a pair of substantially the same denier electroconductive warp yarns 32, 32 which are woven as a single yarn. Likewise, a pair of electrically conductive fill yarns 34, 34 are woven in place of the single larger yarn in FIG. 1.

Figure 4:
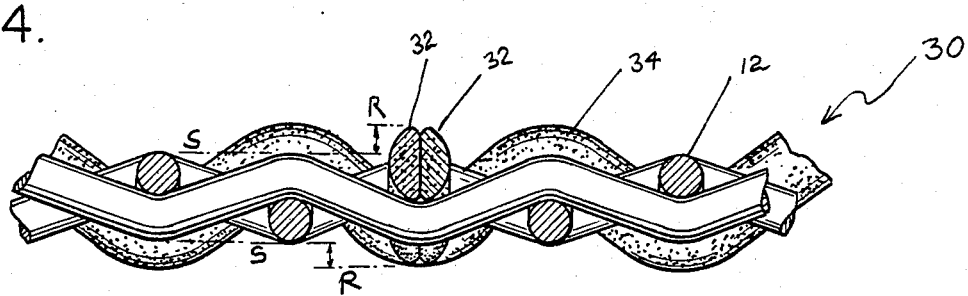
FIG. 4 is a partial section view in enlarged scale taken substantially along the line 4—4 of FIG. 3 in the direction of the arrows.

As shown in the cross section of FIG. 4, the pair of conductive warp yarns 32, 32 form a tight bundle and extend upwardly and downwardly from the surface "S" of the base fabric formed from the warp and fill yarns 12, 14. Likewise, the bundle of electroconductive fill yarns 34, 34 is distorted so that the bundle of electrostatic fill yarns 34 extends above and below the surface of the base fabric. It is also possible that one conductive yarn will lie upon the others. In either instance, the electrostatic warp and fill yarns 32, 34, respectively form a substantially rectangular grid raised to the height "R" above and below the surface "S" of the base fabric.

Figure 5:
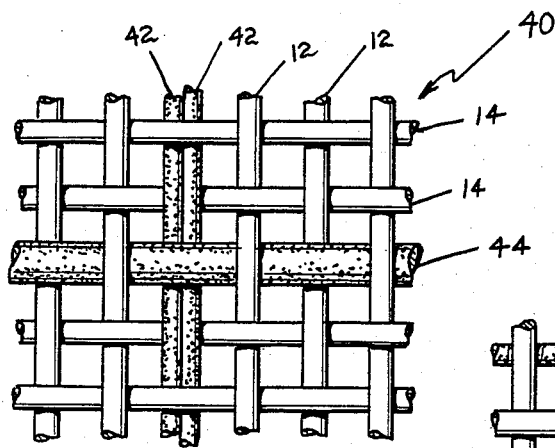
FIG. 5 is a top view of another alternate woven construction of the electrostatic dissipating fabric of the present invention.

FIG. 5 shows still another alternate construction of the improved static dissipating fabric 40 of the present invention utilizing another means of producing the raised grid of electroconductive yarn. Specifically, the base fabric is constructed from warp yarn 12 and fill yarn 14 as in the other examples. However, the electroconductive warp yarn is formed from a bundle of two electroconductive warp yarns 42, 42; while the electroconductive fill yarn 44 is a larger diameter as described in the embodiment shown in FIGS. 1 and 2. Although not shown, the electroconductive warp yarn 42 could have been a single yarn of larger diameter and the electroconductive fill yarn 44 could have been formed from a bundle of smaller diameter electroconductive yarns.

Figure 6:
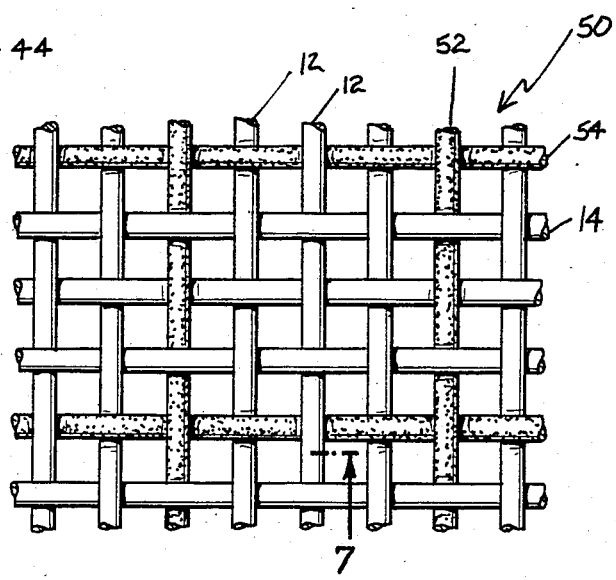
FIG. 6 is a top view of a still further alternate woven construction of the electrostatic dissipating fabric of the present invention.
Figure 7:
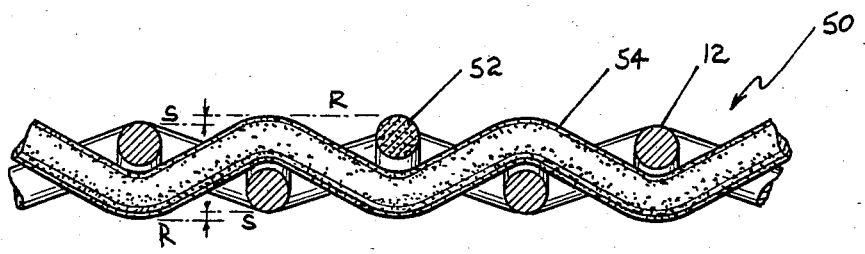
FIG. 7 is a partial sectional view in enlarged scale taken substantially along the line 7—7 of FIG. 6 in the direction of the arrows.

Referring next to the embodiment of the improved static dissipating fabric of the present invention 50 shown in FIGS. 6 and 7, the warp yarns 12 and fill yarns 14 are formed of non-conductive yarns as in the other embodiments. The raised grid of electroconductive warp yarns 52 and electroconductive fill yarns 54, is formed by several methods. For instance, an otherwise conventional weaving loom having double beaming can be used. The double beaming allows a non-conductive warp yarn 12 to be woven at a different pre-weaving tension than the electroconductive warp yarns 52. In order to form a rib, the nonconductive yarns 12 are woven at the normal tension required for weaving satisfactory base fabric and the electroconductive warp fabric is woven at a lower pre-weaving tension. Thus, the finished woven fabric will have a longitudinal rib formed of the electroconductive warp yarn 52 which extends above and below the surface "S" of the base fabric defined by the plane formed by the surface of the non-conductive warp yarns, 12, 12. The electroconductive yarn will extend above and below the base fabric a distance equal to some portion of the diameter of the electrostatic yarns 52 as shown by the broken lines designated "R" in the sectional view of FIG. 7. Likewise, the electroconductive fill yarn 54 is woven into the base fabric at a lower tension than the non-conductive fill yarn and, although both the conductive and non-conductive fill yarns 54, 14 can be of substantially the same diameter, in the finished fabric 50 the electroconductive fill yarn 54 will be raised to a distance "R" off the surface "S" of the remainder of the base fabric forming a substantially rectangular grid with the raised electroconductive warp yarn 52.

Alternatively, the fabric 50 shown in FIGS. 6 and 7 can be produced by weaving the fabric from pre-shrunk electroconductive yarn 52, 54 in the warp and fill directions and from non-preshrunk non-conductive yarn 12, 14. When the woven fabric 50 is subsequently washed and otherwise treated, the nonconductive yarn 12, 14 shrinks the normal amount of approximately 10% while the electroconductive yarn 52, 54 will shrink only approximately 2–3%. Thus, the raised grid, as best shown in FIG. 7, would be produced.

Although the preferred and alternate embodiments of the present invention are described by reference to weaving, it should be understood that similar advantages are obtained by constructing the fabric of the present invention by knitting procedures.

Likewise, the present invention anticipates producing an electrostatic dissipating fabric which has a raised grid or stripe in the warp direction only or in the fill direction only as described in the examples below. In such instance the opposite fill or warp may or may not include an integral electroconductive yarn which is flush with the surface of the base fabric.

The method by which the improved electrostatic dissipation performance of the fabric of the present invention is obtained is not fully understood; however, it is believed that the raised grid may well concentrate the static electricity along the grid lines and thereby result in the enhanced static dissipation performance. The nature or construction of the base fabric is not believed to have a significant impact on the electrostatic dissipation performance.

A series of static dissipating fabrics were produced which demonstrate the enhanced performance resulting from raised grids. Each fabric was then tested using the NASA standard Triboelectric test which uses a teflon wheel to burnish the corner of the fabric to build up a static charge of approximately 22,000 volts. The fabric is held in a frame which is isolated electrically. The frame is then swung down between two electrodes and the electrical potential remaining on the fabric is measured as a function of time.

The first sample was constructed from a woven base fabric formed of non-conductive warp and fill yarns of 200 denier, 100 filament type natural NOMEX polyamide fiber of 3¼ turn "Z" twist. The fabric had a grid which was formed from a 24 denier, 4 filament carbon-doped nylon NO SHOCK yarn sold by Monsanto under the trademark NO SHOCK plied to the same diameter polyamide yarn as the base fabric by a 3¼ "Z" twist. The grid was formed in both the warp and the fill, but was not raised from the surface of the fabric. The flush grid was substantially rectangular and its spacing measured ½ inch by ½ inch.

A second sample was constructed having a base fabric woven from warp yarn and fill yarn each comprised of twice plied 200 denier, 100 filament type aromatic polyamide NOMEX yarn plied in a 3¼ "Z" twist. The grid was woven into the base fabric in both the warp and fill from the same 24 denier, 4 filament carbon-doped nylon yarn as used in the first sample which was plied to the same twice plied NOMEX yarn used in the base fabric. Unlike the prior sample, however, the electrostatic warp yarn was woven in at a lower tension to produce a parallel raised striped in the warp direction approximately ½ inch apart. The grid lines in the fill were also approximately ½ inch apart, but were flush with the surface of the base fabric.

The base fabric of the first sample had a finished count of 99 ends per inch in the warp and 77 picks per inch in the fill producing fabric that weighed 4.8 ounces per square yard and had a permeability to air of 56 cubic feet per minute, as measured by a standardized test. The second sample had a count of 61.5 ends per inch in the warp and 45 picks per inch in the fill; however, since the base fabric used twice plied yarn the fabric weighed 5.9 ounces per square yard and had a permeability of 3.25 cfm. These characteristics of the base fabric are not believed to affect the static dissipating performance of the fabric samples. Significantly, although the grids were woven from the same electroconductive yarns at the same ½ inch by ½ inch spacing and only differed in that the second sample had a raised grid of parallel lines in the warp direction, the samples exhibited greatly different static dissipation performance during the Triboelectric test:

| | Voltage Remaining After Time | | | | | | |
|---|---|---|---|---|---|---|---|
| Time (Seconds) | 0.35 | 0.5 | 1.0 | 2.0 | 3.0 | 4.0 | 5.0 |
| First Sample (flush grid) | 2,000 | 2,000 | 2,000 | 1,900 | 1,900 | 1,900 | 1,900 |
| Second Sample (raised stripe in warp only, flush in fill) | 460 | 420 | 400 | 380 | 380 | 340 | 320 |

Clearly the second sample dissipated far more of the static charge on the fabric.

A third sample was also constructed for comparison. The third sample, however, had a raised grid in both the warp direction and the fill direction, in a ¼ inch by ¼ inch grid pattern. The base fabric was woven of the same warp and fill yarns as the first sample and the electrostatic grid contained an electrostatic warp grid produced by weaving two plied 24 denier, 4 filament Monsanto NO SHOCK carbon-doped yarns to create a raised rip-stop stripe. The fill had a raised grid formed by plying two 24 denier, 4 filament Monsanto NO SHOCK yarns together (to produce a larger effective diameter and therefore, a raised grid in the fill direction). The base fabric had a count of 93 ends per inch in the warp direction and 76 picks per inch in the fill direction producing a fabric that weighed 4.8 ounces per square yard and had a permeability of 10 cfm. However, the raised substantially rectangular grid approximately ¼ inch by ¼ inch produced the following improved voltage dissipation:

| Time (Seconds) | Voltage Remaining After Time | | | | | | |
|---|---|---|---|---|---|---|---|
|  | 0.35 | 0.5 | 1.0 | 2.0 | 3.0 | 4.0 | 5.0 |
| Third Sample (raise rectangular grid) | 720 | 540 | 380 | 260 | 200 | 160 | 140 |

The base fabric can be woven in a configuration such as, for example, a twill or a herringbone. Thus, to the extent the static dissipating fabric of the present invention is utilized in clothing and opacity is a significant factor the herringbone or any similar construction can be utilized. For economy and some degree of comfort, the base fabric can be formed from polyester yarns when used in garments. The integrally constructed parallel or substantially rectangular raised grid will assure that the fabric has the required electrostatic dissipation performance.

When the fabric of the present invention is used as a drop cloth the warp and fill yarn used to produce the base fabric can be an aromatic polyamide such as NOMEX which will then result in a fireproof fabric.

A latitude of modification, change and substitution is intended in the foregoing disclosure and in some instances, some features of the invention will be employed without a corresponding use of other features. Accordingly, it is appropriate that the appended claims be construed broadly and in a matter consistent with the spirit and scope of the invention herein.

We claim:

1. An improved static dissipating fabric comprising a base fabric woven primarily of non-conductive yarn, said base fabric having a front surface and a back surface, a first plurality of raised electroconductive yarns woven into said base fabric extending from said front surface to said back surface of said base fabric and extending beyond the planes of said front and back surfaces in a substantially mutually parallel orientation to each other thereby forming a raised substantially parallel grid on both said front and said back surfaces of said base fabric, a second plurality of raised electroconductive yarns woven into said base fabric in a direction substantially perpendicular to said first plurality of raised electroconductive yarns and extending from said front surface to said back surface of said base fabric and extending beyond the planes of said front and back surfaces forming a raised substantially rectangular grid with said first and second pluralities of raised electroconductive yarns on both said front and back surfaces of said base fabric, said first plurality and said second plurality of raised electroconductive yarns including a combination of carbon doped yarns plied with nonconductive yarns.

2. An improved static dissipating fabric comprising a base fabric primarily woven of non-conductive yarn, said base fabric having a front surface and a back surface, a first plurality of raised electroconductive yarns constructed into said base fabric extending from said front surface to said back surface of said base fabric and extending beyond the planes of said front and back surfaces in a substantially mutually parallel orientation to each other thereby forming a raised substantially parallel grid on both said front and said back surfaces of said base fabric wherein said first plurality of raised electroconductive yarns comprise a combination of electroconductive carbon doped filaments plied with non-conductive filaments and a diameter of said first plurality of said plied electroconductive yarns is greater than a diameter of said yarns forming said base fabric.

3. The improved fabric of claim 2 further including a second plurality of raised electroconductive yarns constructed into said base fabric in a direction substantially perpendicular to said first plurality of raised electroconductive yarns and extending from said front surface to said back surface of said base fabric and extending beyond the planes of said front and back surfaces forming a raised substantially rectangular grid with said first and said second pluralities of raised electroconductive yarns on both said front and back surfaces of said base fabric wherein said first and said second pluralities of raised electroconductive yarns comprise combinations of electroconductive carbon doped filaments plied with non-conductive filaments and a diameter of said first and second pluralities of raised electroconductive yarns are greater than a diameter of said yarns forming said base filament.

4. The improved fabric of claim 2 wherein said grid formed from said first plurality of raised electroconductive yarns has a spacing of ½ inch or less.

5. The improved fabric of claim 3 wherein said rectangular grid formed from said first and second pluralities of raised electroconductive yarns has a spacing of ½ inch or less.

6. An improved static dissipating fabric comprising a base fabric primarily woven of non-conductive yarn, said base fabric having a front surface and a back surface, a first plurality of raised electroconductive yarns constructed into said base fabric extending from said front surface to said back surface of said base fabric and extending beyond the planes of said front and back surfaces in a substantially mutually parallel orientation to each other thereby forming a raised substantially parallel grid on both said front and said back surfaces of said base fabric wherein said first plurality of raised electroconductive filaments plied with non-conductive bulked or texturized filaments and a diameter of said first plurality of said combined electroconductive yarns is greater than a diameter of said yarns forming said base fabric.

7. The improved fabric of claim 6 further including a second plurality of raised electroconductive yarns constructed into said base fabric in a direction substantially perpendicular to said first plurality of raised electroconductive yarns and extending from said front surface to said back surface of said fabric and extending beyond the planes of said front and back surfaces forming a raised substantially rectangular grid with said first and said second pluralities of raised electroconductive yarns on both said front and back surfaces of said base fabric wherein said first and second plurality of raised electroconductive yarns comprise combinations of electroconductive fibers combined with nonconductive bulked or texturized filaments and a diameter of said first and said second pluralities of said combined electroconductive yarns is greater than a diameter of said yarns forming said base fabric.

8. The improved fabric of claim 6 wherein said grid formed from said first plurality of raised electroconductive yarn has a spacing of ½ inch or less.

9. The improved fabric of claim 7 wherein said rectangular grid formed from said first and second pluralities of raised electroconductive yarns has a spacing of ½ inch or less.

10. An improved static dissipating fabric comprising a base fabric primarily woven of non-conductive yarn, said base fabric having a front surface and a back surface, a first plurality of raised electroconductive yarns constructed into said base fabric extending from said front surface to said back surface of said base fabric and extending beyond the planes of said front and back surfaces in a substantially mutually parallel orientation to each other thereby forming a raised substantially parallel grid on both said front and said back surfaces of said base fabric wherein said first plurality of raised electroconductive yarns comprise a combination of two or more yarns having electroconductive carbon doped filaments plied with non-conductive filaments wherein the combined diameter of said two or more plied conductive yarns is greater than a diameter of said yarns forming said base fabric.

11. The improved fabric of claim 10 further including a second plurality of raised electroconductive yarns constructed into said base fabric in a direction substantially perpendicular to said first plurality of raised electroconductive yarns and extending from said front surface to said back surface of said base fabric and extending beyond the planes of said front and back surfaces of said base fabric wherein said first and second pluralities of raised electroconductive yarns each comprise a combination of two or more yarns having electroconductive carbon doped filaments plied with non-conductive filaments wherein the combined diameters of said two or more plied conductive yarns is greater than a diameter of said yarns forming said base fabric.

12. The improved fabric of claim 10 wherein said grid formed from said first plurality of raised electroconductive yarns has a spacing of ½ inch or less.

13. The improved fabric of claim 11 wherein said rectangular grid formed from said first and said second pluralities of raised electroconductive yarns has a spacing of ½ inch or less.

14. An improved static dissipating fabric comprising a base fabric primarily woven of non-conductive yarn, said base fabric having a front surface and a back surface, a first plurality of raised electroconductive yarns constructed into said base fabric extending from said front surface to said back surface of said base fabric and extending beyond the planes of said front and back surfaces in a substantially mutually parallel orientation to each other thereby forming a raised substantially parallel grid on both said front and back surfaces of said base fabric wherein said first plurality of raised electroconductive yarns comprise a combination of electroconductive filaments combined with non-conductive filaments which combination is preshrunk prior to construction and said yarn forming said base fabric is not preshrunk.

15. The improved fabric of claim 14 further including a second plurality of raised electroconductive yarns constructed into said base fabric in a direction substantially perpendicular to said first plurality of raised electrocncutive yarns and extending from said front surface to said back surface of said base fabric and extending beyond the planes of said front and back surfaces forming a raised substantially rectangular grid with said first and said second pluralities of raised electroconductive yarns on both said front and back surfaces of said base fabric wherein said first and second pluralities of raised electroconductive yarns comprise combinations of electroconductive filaments combined with non-conductive filaments which combination is preshrunk prior to construction and said yarn forming said base fabric is not pre shrunk.

16. The improved fabric of claim 14 wherein said grid formed from said first plurality of raised electroconductive yarns has the spacing of ½ inch or less.

17. The improved fabric of claim 15 wherein said rectangular grid formed from said first and second second pluralities of raised electroconductive yarns has a spacing of ½ inch or less.

18. The improved static dissipating fabric comprising a base fabric primarily woven of non-conductive yarn, said base fabric having a front surface and a back surface, a first plurality of raised electroconductive yarns constructed into said base fabric extending from said front surface to said back surface of said base fabric and extending beyond the planes of said front and back surfaces in a substantially mutually parallel orientation to each other thereby forming a raised substantially parallel grid on both said front and said back surfaces of said base fabric wherein said first plurality of raised electroconductive yarns comprise a combination of electroconductive carbon coated filaments plied with non-conductive filaments and a diameter of said first plurality of said plied electroconductive yarns is greater than a diameter of said yarns forming said base fabric.

19. The improved fabric of claim 18 further including a second plurality of raised electroconductive yarns constructed into said base fabric in a direction substantially perpendicular to said first plurality of raised electroconductive yarns and extending from said front surface to said back surface of said base fabric and extending beyond the planes of said front and back surfaces forming a raised substantially rectangular grid with said first and said second pluralities of raised electroconductive yarns on both said front and back surfaces of said base fabric wherein said first and said second pluralities of raised electroconductive yarns comprise combinations of electroconductive carbon coated filaments plied with non-conductive filaments and a diameter of said first and said second pluralities of raised electroconductive yarns are greater than a diameter of said yarns forming said base filament.

20. The improved fabric of claim 18 wherein said grid formed from said first plurality of raised electroconductive yarn has a spacing of ½ inch or less.

21. The improved fabric of claim 19 wherein said rectangular grid formed from said first and said second pluralities of raised electroconductive yarns has a spacing of ½ inch or less.

* * * * *